United States Patent [19]

Nishimura

[11] Patent Number: 5,115,152
[45] Date of Patent: May 19, 1992

[54] AMPLIFIER HAVING POLYGONAL-LINE CHARACTERISTICS EMPLOYING TWO COMPARATORS

[75] Inventor: Kouichi Nishimura, Tokyo, Japan
[73] Assignee: NEC Corporation, Tokyo, Japan
[21] Appl. No.: 766,768
[22] Filed: Sep. 27, 1991
[30] Foreign Application Priority Data
   Sep. 27, 1990 [JP] Japan .................. 2-257781
[51] Int. Cl.[5] .............. H03K 5/24; H03K 5/01
[52] U.S. Cl. ....................... 307/490; 307/358; 307/362; 307/268
[58] Field of Search ............ 307/494, 490, 264, 268, 307/351, 355, 357, 358, 359, 360, 362; 330/252, 310

[56] References Cited

U.S. PATENT DOCUMENTS

| | | | |
|---|---|---|---|
| 3,743,950 | 7/1973 | Sellari et al. | 307/359 |
| 4,998,026 | 3/1991 | King | 307/494 |
| 5,041,795 | 8/1991 | Bowers | 307/494 |

Primary Examiner—Stanley D. Miller
Assistant Examiner—Toan Tran
Attorney, Agent, or Firm—Helfgott & Karas

[57] ABSTRACT

A polygonal-line characteristic amplifier has a minimum-voltage dsicrimination circuit, a maximum-voltage discrimination circuit and a resistor dividing circuit. The minimum-voltage discrimination circuit detects and outputs a lower one of an input voltage and a predetermined reference voltage respectively applied to two non-inverting input terminals thereof. The maximum-voltage discrimination circuit detects and outputs a higher one of an output from the minimum-voltage discrimination circuit and a resistor divided voltage of the input voltage produced by the resistor dividing circuit respectively inputted to two non-inverting input terminals thereof. The maximum-voltage discrimination circuit outputs at its output terminal an output voltage having polygonal-line characteristics corresponding to the input signal applied to a signal input terminal. Since the voltage gain of the amplifier is low when the level of the input signal is high, the output voltage does not exceed its maximum value to thereby make a dynamic range large against the input level.

9 Claims, 4 Drawing Sheets

AMPLIFIER HAVING POLYGONAL-LINE CHARACTERISTICS EMPLOYING TWO COMPARATORS

BACKGROUND OF THE INVENTION

1. Field of the Invention

The present invention relates to a polygonal-line characteristic amplifier and, more particularly, to a polygonal-line characteristic amplifier having characteristics that its gain becomes high when an input voltage is low, while it becomes low when the input voltage is high.

2. Description of the Related Art

As a buffer amplifier, conventionally used is the so-called voltage-follower circuit, as shown in FIG. 1, in which an operational amplifier 2 has an inverting input terminal (−) connected to an output terminal 3 thereof so as to form an output of the voltage-follower circuit, and a non-inverting input terminal (+) serves as a signal input terminal 1. An input/output gain of the voltage-follower circuit shown in FIG. 1 is "1", so that the input-output characteristic at this time between an input voltage $V_{IN}$ and an output voltage $V_{OUT}$ is as shown in FIG. 2 in which an output signal having the same voltage as that of an input signal applied to the input terminal 1 appears at the output terminal 3, while the input-output characteristic becomes saturated at a certain point in an output dynamic range. This is because the input-output characteristic depends on a positive power supply voltage.

The polygonal-line characteristic amplifier using the conventional voltage-follower buffer amplifier has a disadvantage in that the output voltage of the circuit is limited to the output dynamic range of the amplifier, so that the output voltage becomes fixed to a constant value which is limited by the maximum output voltage of the amplifier when the level of the input signal becomes equal to or more than a certain value.

SUMMARY OF THE INVENTION

It is, therefore, an object of the present invention to overcome the above disadvantage existing in the conventional amplifier and to provide an improved amplifier having polygonal-line characteristics.

It is another object of the present invention to provide a polygonal-line characteristic circuit in which a gain is lowered when an input voltage is high so that the output voltage of the buffer amplifier does not exceed its maximum value to thereby make an input dynamic range large.

In order to attain the above objects, according to an aspect of the present invention, there is provided a polygonal-line characteristic amplifier which comprises:

a signal input terminal and a signal output terminal;

a minimum-voltage discrimination circuit having a differential circuit configuration and having an inverting input terminal, a pair of non-inverting input terminals and an output terminal, the inverting input terminal being connected to the output terminal, one of the non-inverting input terminals being supplied with an input voltage applied to the signal input terminal, and the other non-inverting input terminal being supplied with a predetermined reference voltage; and a maximum-voltage discrimination circuit having a differential circuit configuration and having an inverting input terminal, a pair of non-inverting input terminals and an output terminal, the inverting input terminal and the output terminal of the maximum-voltage discrimination circuit being connected to each other, one of the non-inverting input terminals of the maximum-voltage discrimination circuit being connected to the output terminal of the minimum-voltage discrimination circuit, and the other non-inverting input terminal of the maximum-voltage discrimination circuit being supplied with a resistor divided voltage of the input voltage, whereby the maximum-voltage discrimination circuit outputs from its output terminal a polygonal-line characteristic voltage corresponding to the input voltage.

According to another aspect of the present invention, in the above circuit configuration according to the first aspect of the invention, the inverting input terminal of the minimum-voltage discrimination circuit is connected to a junction point of a series connection of a pair of resistors connected between the output terminal of the same and the ground, one of the non-inverting input terminals of the maximum-voltage discrimination circuit is connected to the output terminal of the minimum-voltage discrimination circuit, and the other non-inverting input terminal of the maximum-voltage discrimination circuit being supplied with the input voltage.

BRIEF DESCRIPTION OF THE DRAWINGS

The above and other objects, features and advantages of the present invention will be apparent from the following description of preferred embodiments of the invention explained with reference to the accompanying drawings, in which.

DETAILED DESCRIPTION OF PREFERRED EMBODIMENTS

Now, some embodiments of the present invention will be described hereunder with reference to the accompanying drawings.

Figure 1:
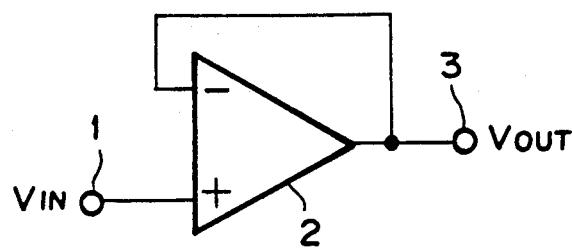
FIG. 1 is a circuit diagram showing the configuration of a conventional example.
Figure 2:
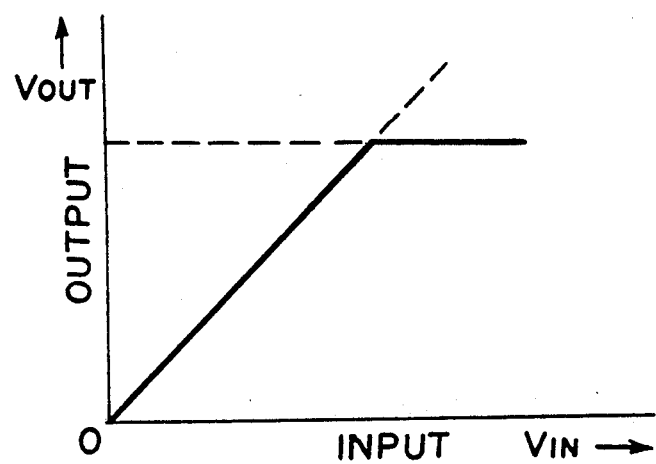
FIG. 2 is a graph showing the input-output characteristic of the conventional example.
Figure 3:
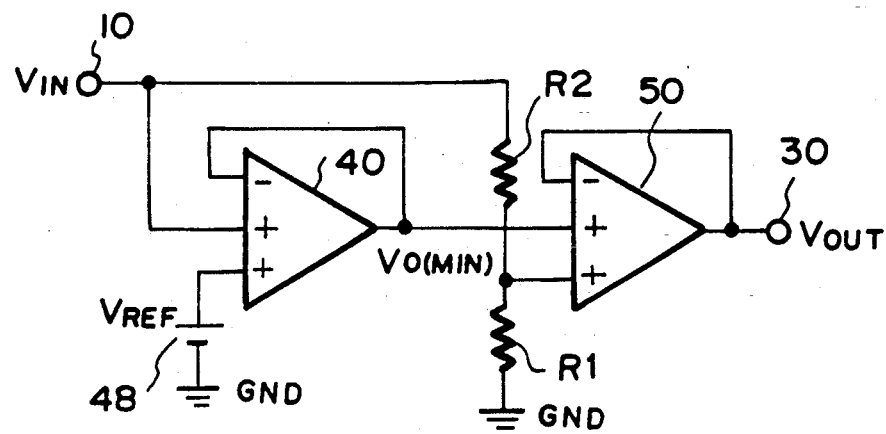
FIG. 3 is a circuit diagram showing a first embodiment of the polygonal-line characteristic amplifier according to the present invention.

FIG. 3 is a circuit diagram showing a first embodiment of the polygonal-line characteristic amplifier according to the present invention.

The amplifier of the invention is constituted mainly by a minimum-voltage discrimination circuit 40 and a maximum-voltage discrimination circuit 50 connected in series.

Specifically, the minimum-voltage discrimination circuit 40 has two non-inverting input terminals (+), one inverting input terminal (−) and an output terminal, the inverting input terminal and the output terminal being connected with each other. One of the two non-inverting input terminals is connected to a signal input terminal 10, and the other non-inverting input terminal is connected to a constant-voltage source 48 for applying a reference voltage $V_{REF}$ thereto.

Similarly to the minimum-voltage discrimination circuit 40, the maximum-voltage discrimination circuit 50 has two non-inverting input terminals (+), one inverting input terminal (−) and an output terminal, the inverting input terminal and the output terminal being connected with each other. One of the two non-inverting input terminals of the maximum-voltage discrimination circuit 50 is connected to the output terminal of the minimum-voltage discrimination circuit 40, and the other non-inverting input terminal of the maximum-voltage discrimination circuit 50 is connected to a junction point between a series of resistors R1 and R2 connected between the signal input terminal 10 and the ground GND. The resistors R1 and R2 constitute a voltage divider circuit which produces a resistor divided voltage obtained on the basis of an input voltage $V_{IN}$ applied to the signal input terminal 10 and a resistance-dividing ratio set by the voltage divider circuit. The output of the maximum-voltage discrimination circuit 50 is outputted as a final output $V_{OUT}$ through an output terminal 30.

In FIG. 3 circuit, a lower one of the two input voltages $V_{REF}$ and $V_{IN}$ applied to the minimum-voltage discrimination circuit 40 is outputted from the minimum-voltage discrimination circuit 40 as an output thereof. More specifically, when the input reference voltage $V_{REF}$ is higher than the input voltage $V_{IN}$, that is, when $V_{REF} > V_{IN}$, an output voltage $V_{O(MIN)}$ of the minimum-voltage discrimination circuit 40 becomes as follows:

$$V_{O(MIN)} = V_{IN} \quad (1)$$

That is, the same voltage as the input voltage $V_{IN}$ is outputted as the output voltage $V_{O(MIN)}$.

On the other hand, when the input reference voltage $V_{REF}$ is lower than the input voltage $V_{IN}$, that is, when $V_{REF} < V_{IN}$, the output voltage $V_{O(MIN)}$ becomes as follows:

$$V_{O(MIN)} = V_{REF} \quad (2)$$

Thus, the output voltage $V_{O(MIN)}$ becomes constant irrespective of the level of the input signal.

Next, as to the operation of the maximum-voltage discrimination circuit 50, a higher one of the two input voltages applied to the maximum-voltage discrimination circuit 50, that is, a higher one of the output voltage $V_{O(MIN)}$ of the minimum-voltage discrimination circuit 40 and the resistor divided voltage, which is $V_{IN} \times [R_1/(R_1+R_2)]$, obtained on the basis of the input voltage $V_{IN}$ and the resistance values of the resistors R1 and R2 ("$r_1$" and "$r_2$" represent their resistance values), is outputted through the output terminal 30. That is, when the resistor divided voltage $V_{IN} \times [R_1/(R_1+R_2)]$ is lower than the output voltage $V_{O(MIN)}$, the output voltage $V_{OUT}$ of the maximum-voltage discrimination circuit 50 is as follows:

$$V_{OUT} = V_{O(MIN)} \quad (3)$$

On the other hand, when the resistor divided voltage $V_{IN} \times [R_1/(R_1+R_2)]$ is higher than the output voltage $V_{O(MIN)}$, the output voltage $V_{OUT}$ is as follows:

$$V_{OUT} = \frac{V_{IN} \cdot R_1}{R_1 + R_2} \quad (4)$$

Figure 4:
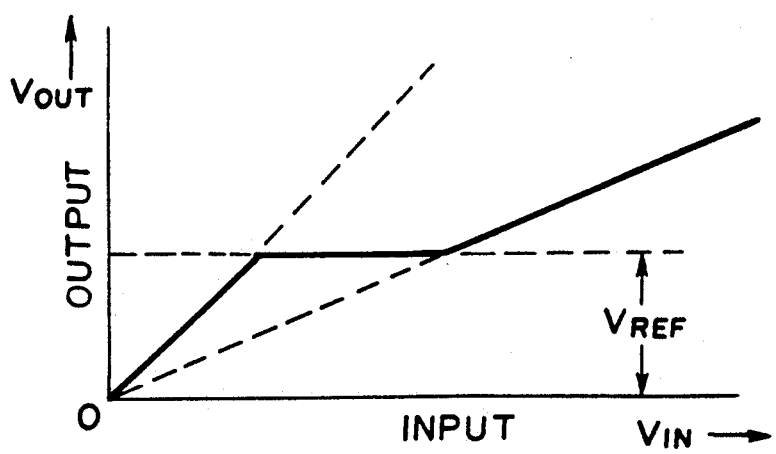
FIG. 4 is a graph showing the input-output characteristic of the first embodiment.

From the above equations (1)-(4), the input-output characteristic between the input voltage $V_{IN}$ and the output voltage $V_{OUT}$ is expressed in a graph as shown in FIG. 4. Thus, a desired polygonal-line characteristic is obtained.

Figure 5:
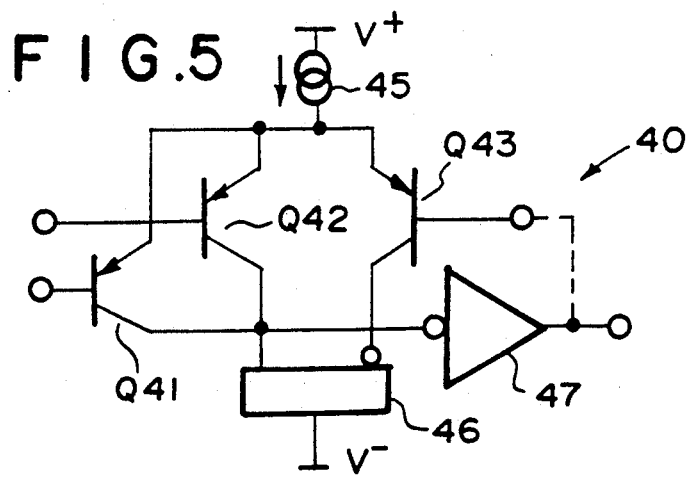
FIG. 5 is a circuit diagram showing an example of the minimum-voltage discrimination circuit shown in FIG. 3.

Next, FIG. 5 shows a detailed circuit diagram of the minimum-voltage discrimination circuit 40 for detecting the lower or minimum voltage of two inputs.

The minimum-voltage discrimination circuit 40 comprises: three PNP-transistors Q41, Q42 and Q43 respectively having emitters commonly connected to each other; a constant-current source 45 connected between a power source (V+) and the connection point of the commonly connected emitters; a current-mirror circuit 46 having an output terminal connected to respective collectors of the PNP-transistors Q41, Q42 and an input terminal connected to a collector of the PNP-transistor Q43 and functioning as an active load; and an inversion buffer amplifier 47 having an input terminal connected to the output terminal of the current-mirror circuit 46 and an output terminal connected to a base of the PNP-transistor Q43 which is an inverting input terminal. Respective bases of the PNP-transistors Q41 and Q42 are two non-inverting input terminals. The base of the PNP-transistor Q43 which is the inverting input terminal, and the output terminal of the buffer amplifier 47 are connected to each other so as to form an output terminal of the minimum-voltage discrimination circuit 40.

Here, since the emitters of the PNP-transistors Q41 and Q42 are connected to each other, one of the PNP-transistors having a base input voltage lower than that of the other PNP-transistor becomes an active state while the other PNP-transistor becomes a cut-off state. The one PNP-transistor Q41 or Q42 which becomes an active state cooperates with the PNP-transistor Q43 to constitute a differential amplifier. Since the base, which is the inverting input terminal, of the PNP-transistor Q43 and the output of the buffer amplifier 47 are connected with each other, a voltage-follower configuration is formed, so that the lower or minimum one voltage between the two inputs is outputted as it is.

Figure 6:
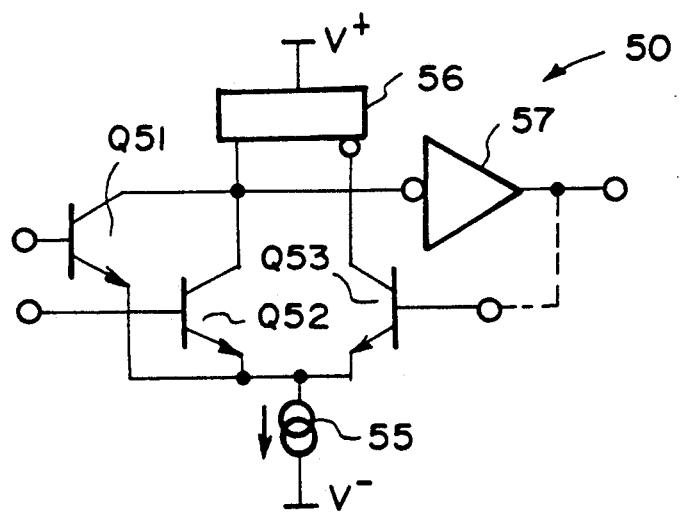
FIG. 6 is a circuit diagram showing an example of the maximum-voltage discrimination circuit shown in FIG. 3.

Next, FIG. 6 shows a detailed circuit diagram of the maximum-voltage discrimination circuit 50 for detecting the larger or maximum one voltage between the two inputs. As seen from the drawings, the configuration of the circuit connection of FIG. 6 is similar to that of FIG. 5 except that the circuit connection is different from that of FIG. 5 in that the PNP-type transistors Q41 to Q43 of FIG. 5 are substituted by NPN-type transistors Q51 to Q53, and that the polarities and connections of the constant-current source and the current-mirror circuit are reversed. Accordingly, the description as to the configuration of the circuit connection will be omitted here. The difference in operation between the cases of FIGS. 5 and 6 is in that, since the input transistors having emitters connected to each other are constituted by the NPN-type transistors Q51, Q52 and Q53 in the case of FIG. 6, one of the two NPN-transistors to which one of the two input voltages higher than the other is applied becomes a conductive state. Accordingly, the higher or maximum one voltage between the two inputs is outputted from this maximum-voltage discrimination circuit 50.

Figure 7:
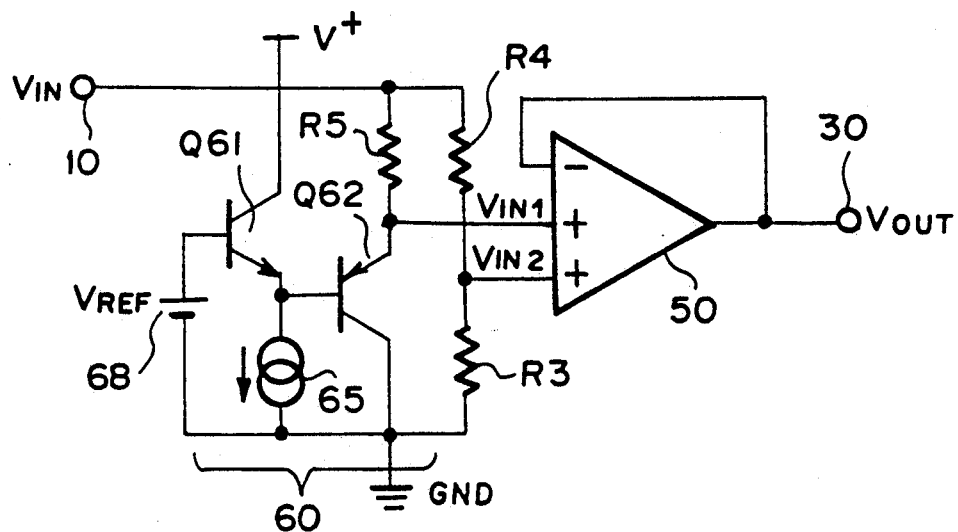
FIG. 7 is a circuit diagram showing a second embodiment of the polygonal-line characteristic amplifier according to the present invention.

FIG. 7 is a circuit diagram showing a second embodiment of the present invention. Here, the minimum-voltage discrimination circuit 40 of FIG. 3 is more simplified. Specifically, the minimum-voltage discrimination circuit 60 of this embodiment is constituted by: a resistor R5 having one end connected to the signal input terminal 10; a PNP-transistor Q62 having an emitter connected to the other end of the resistor R5, a collector connected to the ground GND, and a base connected to the ground GND through the constant-current source 65; and an NPN-transistor Q61 having a collector connected to the power source (V+), an emitter connected to the base of the PNP-transistor Q62 and also connected to the GND through the constant-current source 65, and a base connected to a constant-voltage source 68 supplying a predetermined constant voltage $V_{REF}$. An output of this minimum-voltage discrimination circuit 60 which is supplied to one ($V_{IN1}$) of two non-inverting input terminals ($V_{IN1}$, $V_{IN2}$) of the following maximum-voltage discrimination circuit 50 is derived from the junction point between the resistor R5 and the emitter of the PNP-transistor Q62.

Here, assume that the voltage across the emitter and the base of the PNP-transistor Q62 is equal to that of the NPN-transistor Q61. When an input voltage $V_{IN}$ applied to the input terminal 10 is lower than the reference voltage $V_{REF}$ of the constant-voltage source 68, that is, $V_{IN} < V_{REF}$, the PNP-transistor Q62 becomes a cut-off state so that no current flows through the resistor R5. Accordingly, the voltage $V_{IN}$ is applied as it is to the one input terminal $V_{IN1}$ of the maximum-voltage discrimination circuit 50. On the other hand, when the input voltage $V_{IN}$ is higher than the reference voltage $V_{REF}$, that is, $V_{IN} > V_{REF}$, the PNP-transistor Q62 becomes a conductive state so that the constant reference voltage $V_{REF}$ is applied to the one input terminal $V_{IN1}$ of the maximum-voltage discrimination circuit 50. In this way, the combination of the resistor R5, the PNP-transistor Q62, the NPN-transistor Q61, the constant-voltage source 68 and the constant-current source 65 functions as the minimum-voltage discrimination circuit required in this invention. Since the circuit arrangement and function of the maximum-voltage discrimination circuit 50 and the voltage applied to the other non-inverting input terminal $V_{IN2}$ thereof are the same as those in the case of FIG. 3, the description thereof will not be repeated here.

As described above, this second embodiment has the advantage that the necessary minimum-voltage discrimination circuit can be realized by only three circuit elements.

Figure 8:
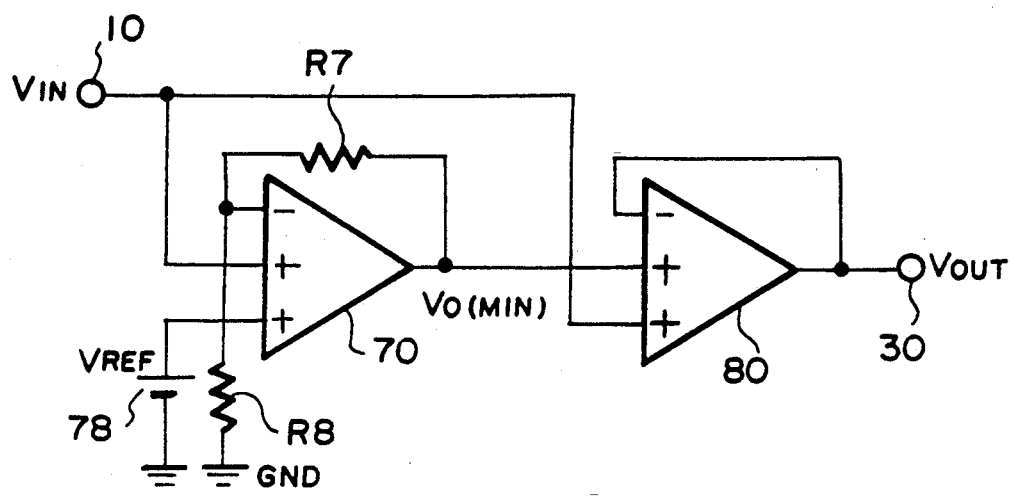
FIG. 8 is a circuit diagram showing a third embodiment of the polygonal-line characteristic amplifier according to the present invention.

FIG. 8 is a circuit diagram of a third embodiment of the present invention. In this third embodiment, in order to make the voltage gain of a minimum-voltage discrimination circuit higher than that of a maximum-voltage discrimination circuit, the voltage gain of the minimum-voltage discrimination circuit 70 is made high and the voltage gain of the maximum-voltage discrimination circuit 80 is made "1". That is, a feedback resistor R7 (resistance value being $R_7$) is connected between an inverting input terminal and an output terminal of the minimum-voltage discrimination circuit 70, and further an input resistor R8 (resistance value being $R_8$) is connected between the inverting input terminal of the minimum-voltage discrimination circuit 70 and the ground GND. One of two non-inverting input terminals of the minimum-voltage discrimination circuit 70 is connected to the signal input terminal 10, while the other non-inverting input terminal thereof is connected to a constant-voltage source 78 supplying a predetermined reference voltage $V_{REF}$. On the other hand, for the voltage gain of the maximum-voltage discrimination circuit 80 to be "1", an inverting input terminal and an output terminal of the maximum-voltage discrimination circuit 80 are directly connected to each other. An output having a polygonal-line characteristic is derived from an output terminal 30. The output terminal of the minimum-voltage discrimination circuit 70 is connected to one of two non-inverting input terminals of the maximum-voltage discrimination circuit 80. Further, the signal input terminal 10 is connected to the other non-inverting input terminal of the maximum-voltage discrimination circuit 80.

Here, the voltage gain $A_{vmin}$ of the minimum-voltage discrimination circuit 70 is determined by the resistance values $R_7$ and $R_8$ as follows:

$$A_{vmin} = 1 + \frac{R_7}{R_8} \tag{5}$$

In FIG. 8 circuit, the lower one voltage between the two inputs $V_{REF}$ and $V_{IN}$ is multiplied by $A_{vmin}$ in accordance with the above equation (5) and the product is outputted as an output $V_{O(MIN)}$ from the minimum-voltage discrimination circuit 70. That is, when the reference voltage $V_{REF}$ is higher than the input voltage $V_{IN}$, namely $V_{REF} > V_{IN}$, the output voltage $V_{O(MIN)}$ becomes as follows:

$$V_{O(MIN)} = V_{IN} \times A_{vmin} \tag{6}$$

Thus, the voltage obtained by multiplying the input $V_{IN}$ by $A_{vmin}$ is outputted as the output voltage $V_{O(MIN)}$. Next, when the reference voltage $V_{REF}$ is lower than the input voltage $V_{IN}$, that is, $V_{REF} < V_{IN}$, the output voltage $V_{O(MIN)}$ becomes as follows:

$$V_{O(MIN)} = V_{REF} \times A_{vmin} \tag{7}$$

Accordingly, a constant voltage is outputted regardless of the level of the input voltage $V_{IN}$.

Next, as an output of the maximum-voltage discrimination circuit 80, the higher voltage of the two inputs applied thereto, that is, the higher one of the output voltage $V_{O(MIN)}$ and the input voltage $V_{IN}$, is outputted from the output terminal 30. That is, when the input voltage $V_{IN}$ is lower than the output voltage $V_{O(MIN)}$, namely $V_{IN} < V_{O(MIN)}$, the overall output voltage $V_{OUT}$ appearing at the output terminal 30 becomes as follows:

$$V_{OUT} = V_{O(MIN)} \tag{8}$$

Further, when the input voltage $V_{IN}$ is higher than the output voltage $V_{O(MIN)}$ from the minimum-voltage discrimination circuit 70, that is, $V_{IN} > V_{O(MIN)}$, the output voltage $V_{OUT}$ becomes as follows:

$$V_{OUT} = V_{IN} \quad (9)$$

Figure 9:
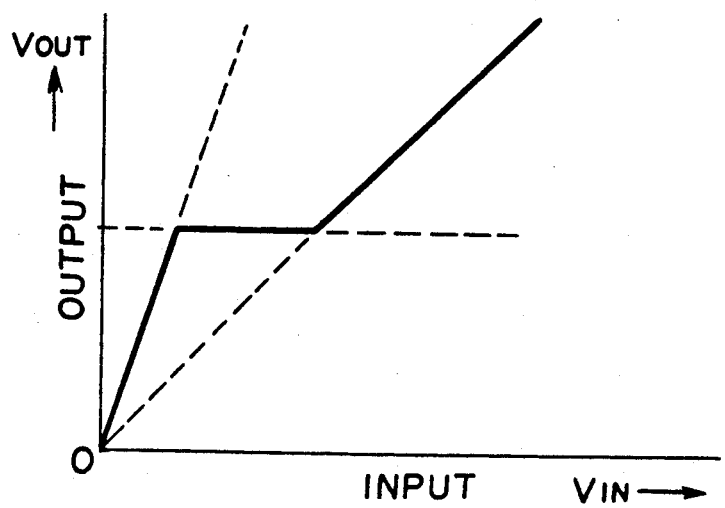
FIG. 9 is a graph showing the input-output characteristic of the third embodiment.

From the above equations (6)–(9), the input-output characteristic between the input voltage $V_{IN}$ and the output voltage $V_{OUT}$ is expressed in such a graph as shown in FIG. 9, whereby a desired polygonal-line characteristic is obtained.

As described above, the present invention has an effect that a gain is lowered when an input voltage is high so that the output voltage of the buffer amplifier does not exceed its maximum value to thereby make an input dynamic range large.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A polygonal-line characteristic amplifier comprising:
    a signal input terminal and a signal output terminal;
    a minimum-voltage discrimination circuit for detecting and outputting a lower one of two input voltages respectively applied to two non-inverting input terminals of said minimum-voltage discrimination circuit, one of said non-inverting input terminals being supplied with an input voltage applied to said signal input terminal and the other of said non-inverting input terminals being supplied with a predetermined reference voltage; and
    a maximum-voltage discrimination circuit for detecting and outputting a higher one of two input voltages respectively applied to two non-inverting input terminals of said maximum-voltage discrimination circuit, one of said two non-inverting input terminals of said maximum-voltage discrimination circuit being supplied with the output from said minimum-voltage discrimination circuit,
    whereby a polygonal-line characteristic voltage corresponding to an input voltage applied to said signal input terminal is outputted from said signal output terminal.

2. A polygonal-line characteristic amplifier according to claim 1, further comprising a voltage dividing circuit for producing a divided voltage of said input voltage, formed by two resistors connected in series between said signal input terminal and the ground, said divided voltage being inputted to the other of said two non-inverting input terminals of said maximum-voltage discrimination circuit.

3. A polygonal-line characteristic amplifier according to claim 1, in which:
    said minimum-voltage discrimination circuit has a voltage gain of $A_{Vmin}$ and outputs an amplified lower one of said two input voltages respectively applied to said two non-inverting input terminals thereof; and
    said maximum-voltage discrimination circuit has a voltage gain of "1" and receives directly said input voltage at the other one of said two non-inverting input terminals thereof.

4. A polygonal-line characteristic amplifier comprising:
    a signal input terminal and a signal output terminal;
    a minimum-voltage discrimination circuit having a differential circuit configuration and having an inverting input terminal, a pair of non-inverting input terminals and an output terminal, said inverting input terminal being connected to said output terminal, one of said non-inverting input terminals being supplied with an input voltage applied to said signal input terminal, and the other non-inverting input terminal being supplied with a predetermined reference voltage; and
    a maximum-voltage discrimination circuit having a differential circuit configuration and having an inverting input terminal, a pair of non-inverting input terminals and an output terminal, said inverting input terminal and said output terminal of said maximum-voltage discrimination circuit being connected to each other, one of said non-inverting input terminals of said maximum-voltage discrimination circuit being connected to said output terminal of said minimum-voltage discrimination circuit, and the other non-inverting input terminal of said maximum-voltage discrimination circuit being supplied with a resistor divided voltage of said input voltage.
    whereby said maximum-voltage discrimination circuit outputs from its output terminal a polygonal-line characteristic voltage corresponding to said input voltage.

5. A polygonal-line characteristic amplifier according to claim 4, in which a series connection of a pair of resistors is connected between said signal input terminal to which said input voltage is externally applied and the ground so that said resistor divided voltage is obtained from a junction point between said pair of resistors.

6. A polygonal-line characteristic amplifier according to claim 4, in which:
    said minimum-voltage discrimination circuit is constituted by a first transistor, a second transistor, a third transistor, a first inversion buffer amplifier, a first current-mirror circuit and a first constant-current source, respective emitters of said first, second and third transistors being commonly connected to said first constant-current source, a base of said first transistor being supplied with said predetermined reference voltage, a base of said second transistor being supplied with said input voltage applied to said signal input terminal, collectors of said first and second transistors being commonly connected to an output terminal of said first current-mirror circuit and to an inverted input terminal of said first inversion buffer amplifier, a collector of said third transistor being connected to an inverted input terminal of said first current-mirror circuit, a base of said third transistor being connected to an output terminal of said first inversion buffer amplifier so as to act as said output terminal of said minimum-voltage discrimination circuit; and
    said maximum-voltage discrimination circuit is constituted by a fourth transistor, a fifth transistor, a sixth transistor, a second inversion buffer amplifier, a second current-mirror circuit and a second constant-current source, respective emitters of said fourth, fifth and sixth transistors being commonly connected to said second constant-current source, a base of said fourth transistor being connected to said output terminal of said minimum-voltage discrimination circuit, a base of said fifth transistor being supplied with said resistor divided voltage, collectors of said fourth and fifth transistors being commonly connected to an output terminal of said second current-mirror circuit and also to an inverted input terminal of said second inversion buffer amplifier, a collector of said sixth transistor being connected to an inverted input terminal of said second current-mirror circuit, a base of said sixth transistor being connected to an output terminal of said second inversion buffer amplifier so as to act as said output terminal of said maximum-voltage discrimination circuit.

7. A polygonal-line characteristic amplifier according to claim 6, in which said first to third transistors in said minimum-voltage discrimination circuit are all of a PNP-type and said fourth to sixth transistors in said maximum-voltage discrimination circuit are all of an NPN-type.

8. A polygonal-line characteristic amplifier according to claim 1, in which said minimum-voltage discrimination circuit is constituted by a resistor, an NPN-transistor, a PNP-transistor, a constant-current source, a base of said NPN-transistor being supplied with said predetermined reference voltage, a collector of said NPN-transistor being connected to an external positive voltage source, an emitter of said NPN-transistor being connected to a base of said PNP-transistor and to said constant-current source, a collector of said PNP-transistor being connected to the ground, an emitter of said PNP-transistor being coupled to said signal input terminal through said resistor, said emitter of said PNP-transistor acting as said output terminal of said minimum-voltage discrimination circuit.

9. A polygonal-line characteristic amplifier comprising:
a signal input terminal and a signal output terminal;
a minimum-voltage discrimination circuit having a differential circuit configuration and having an inverting input terminal, a pair of non-inverting input terminals and an output terminal, said inverting input terminal being connected to said output terminal through a first resistor and to the ground through a second resistor, one of said non-inverting input terminals being supplied with an input voltage applied to said signal input terminal, and the other non-inverting input terminal being supplied with a predetermined reference voltage; and
a maximum-voltage discrimination circuit having a differential circuit configuration and having an inverting input terminal, a pair of non-inverting input terminals and an output terminal, said inverting input terminal and said output terminal of said maximum-voltage discrimination circuit being connected to each other, one of said non-inverting input terminals of said maximum-voltage discrimination circuit being connected to said output terminal of said minimum-voltage discrimination circuit, and the other non-inverting input terminal of said maximum-voltage discrimination circuit being supplied with said input voltage applied to said signal input terminal.
whereby said maximum-voltage discrimination circuit outputs from its output terminal a polygonal-line characteristic voltage corresponding to said input voltage.

* * * * *